(12) United States Patent
Moriyama

(10) Patent No.: US 12,513,929 B2
(45) Date of Patent: Dec. 30, 2025

(54) SEMICONDUCTOR DEVICE AND METHOD OF MANUFACTURING THE SAME

(71) Applicant: Sumitomo Electric Industries, Ltd., Osaka (JP)

(72) Inventor: Yutaka Moriyama, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 650 days.

(21) Appl. No.: 17/748,230

(22) Filed: May 19, 2022

(65) Prior Publication Data

US 2023/0042190 A1 Feb. 9, 2023

(30) Foreign Application Priority Data

Aug. 5, 2021 (JP) ................. 2021-128825

(51) Int. Cl.
*H10D 30/01* (2025.01)
*H01L 21/68* (2006.01)
*H01L 23/544* (2006.01)
*H10D 30/47* (2025.01)

(52) U.S. Cl.
CPC ......... *H10D 30/015* (2025.01); *H01L 21/681* (2013.01); *H01L 23/544* (2013.01); *H10D 30/4732* (2025.01); *H01L 2223/54426* (2013.01)

(58) Field of Classification Search
None
See application file for complete search history.

(56) References Cited

U.S. PATENT DOCUMENTS

| | | | |
|---|---|---|---|
| 2016/0252753 A1* | 9/2016 | Deng | G03F 7/70358 29/281.5 |
| 2020/0053883 A1 | 2/2020 | Inoue | |
| 2020/0242808 A1* | 7/2020 | Watanabe | G06Q 30/0185 |
| 2022/0382175 A1* | 12/2022 | Sokolov | G03F 9/7088 |

FOREIGN PATENT DOCUMENTS

| | | |
|---|---|---|
| JP | 2000-164636 A | 6/2000 |
| JP | 2001-174672 A | 6/2001 |
| JP | 2002-134561 A | 5/2002 |
| JP | 2004-311569 A | 11/2004 |
| JP | 2013-077765 A | 4/2013 |
| JP | 2016-001731 A | 1/2016 |
| JP | 2019-176149 A | 10/2019 |
| WO | 2014/017159 A1 | 1/2014 |

* cited by examiner

*Primary Examiner* — Michelle Mandala
(74) *Attorney, Agent, or Firm* — Volpe Koenig

(57) ABSTRACT

A method for manufacturing a semiconductor device includes preparing a first substrate provided with a first pattern on a first surface, and a semiconductor chip having a second surface, and a third surface opposite to the second surface, and including a second pattern provided on the second surface, recognizing the first pattern from a position near the first surface among the first surface and an opposite surface thereof in the first substrate, recognizing the second pattern by transmitting through the semiconductor chip from a position near the third surface among the second surface and the third surface in the semiconductor chip, aligning the semiconductor chip and the first substrate based on a recognition result of the first pattern and the second pattern, and bonding the semiconductor chip to the first substrate so that the second surface faces the first surface.

8 Claims, 15 Drawing Sheets

SEMICONDUCTOR DEVICE AND METHOD OF MANUFACTURING THE SAME

CROSS REFERENCE TO RELATED APPLICATIONS

This application claims priority based on Japanese Patent Application No. 2021-128825 filed on Aug. 5, 2021, and the entire contents of the Japanese patent applications are incorporated herein by reference.

FIELD

The present disclosure relates to a semiconductor device and a method for manufacturing the same, for example, a semiconductor device to which a semiconductor chip is bonded and a method for manufacturing the same.

BACKGROUND

Nitride semiconductor devices such as GaN HEMT (Gallium Nitride High Electron Mobility Transistor) are used in high-frequency power amplification devices for base stations of mobile communication. It is known that a semiconductor chip such as GaN HEMT is face-up mounted on a heat dissipation member (for example, Patent Document 1: Japanese Laid open Patent Publication No. 2019-176149).

SUMMARY

A method for manufacturing a semiconductor device according to the present disclosure includes: preparing a first substrate provided with a first pattern on a first surface, and a semiconductor chip having a second surface, and a third surface opposite to the second surface, and including a second pattern provided on the second surface; recognizing the first pattern from a position near the first surface among the first surface and an opposite surface thereof in the first substrate; recognizing the second pattern by transmitting through the semiconductor chip from a position near the third surface among the second surface and the third surface in the semiconductor chip; aligning the semiconductor chip and the first substrate based on a recognition result of the first pattern and the second pattern; and bonding the semiconductor chip to the first substrate so that the second surface faces the first surface.

A semiconductor device according to the present disclosure includes: a substrate provided with a first pattern on a first surface; and a semiconductor chip having a second surface, and a third surface opposite to the second surface, and including a second pattern provided on the second surface, wherein an arithmetic mean roughness of the third surface is 0.1 μm or less, and the semiconductor chip is bonded to the substrate so that the second surface faces the first surface; wherein the semiconductor chip is transparent to light having at least a part of wavelengths of visible light and infrared light.

DETAILED DESCRIPTION OF EMBODIMENTS

Figure 1:
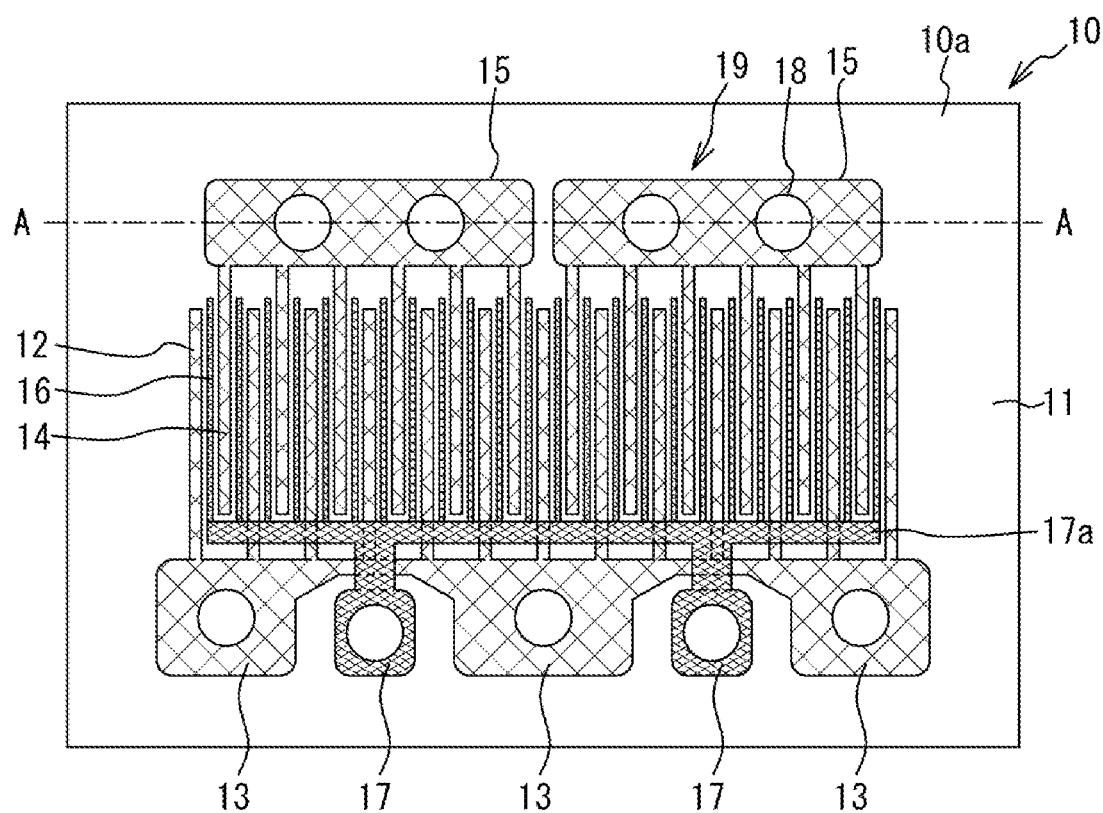
FIG. 1 is a plan view illustrating a semiconductor chip according to a first embodiment.

In face-up mounting, since a bonding wire is used for electrical connection with the semiconductor chip, the high frequency characteristics are likely to deteriorate. In order to improve the high frequency characteristics, it is conceivable to flip-chip bond (i.e., face-down mounting) the semiconductor chip. A flip-chip bonder is used to flip-chip bonds the semiconductor chip on a substrate. However, the flip-chip bonder has a complicated mechanism and has a long takt time (i.e., pitch time) for mounting the semiconductor chip on the substrate. Therefore, the flip chip bonder is not suitable for mass production, and the manufacturing cost is increased.

It is an object of the present disclosure to provide a semiconductor device and a method for manufacturing the same that can reduce the cost.

Description of Embodiments of the Present Disclosure

First, the contents of the embodiments of this disclosure are listed and explained.

(1) A method for manufacturing a semiconductor device according to the present disclosure includes: preparing a first substrate provided with a first pattern on a first surface, and a semiconductor chip having a second surface, and a third surface opposite to the second surface, and including a second pattern provided on the second surface; recognizing the first pattern from a position near the first surface among the first surface and an opposite surface thereof in the first substrate; recognizing the second pattern by transmitting through the semiconductor chip from a position near the third surface among the second surface and the third surface in the semiconductor chip; aligning the semiconductor chip and the first substrate based on a recognition result of the first pattern and the second pattern; and bonding the semiconductor chip to the first substrate so that the second surface faces the first surface. Thereby, the cost of the semiconductor device can be reduced.

(2) The recognizing the first pattern may include recognizing the first pattern from above in a state where the first substrate is arranged on the first stage with the first surface facing up and the semiconductor chip is arranged on the second stage with the third surface facing up. The recognizing the second pattern may include recognizing the second pattern by transmitting through the semiconductor chip in the state. The bonding the semiconductor chip may include mounting semiconductor chip on the first substrate by sucking the third surface of the semiconductor chip on the second stage and moving the semiconductor chip onto the first stage.

(3) The semiconductor chip may be transparent to light having at least a part of wavelengths of visible light and infrared light. The recognizing the second pattern may include recognizing the second pattern by using the light having at least the part of the wavelengths.

(4) The semiconductor chip may be a SiC substrate, a sapphire substrate, or a GaN substrate. The semiconductor chip may include a second substrate having the third surface, and a nitride semiconductor layer provided on the second substrate and having the second surface.

(5) An arithmetic mean roughness of the third surface may be 0.1 μm or less.

(6) The semiconductor chip may process a high frequency signal.

(7) The method for manufacturing the semiconductor device may further include forming a metal layer on the third surface of the semiconductor chip after the bonding.

(8) A semiconductor device according to the present disclosure includes: a substrate provided with a first pattern on a first surface; and a semiconductor chip having a second surface, and a third surface opposite to the second surface, and including a second pattern provided on the second surface, wherein an arithmetic mean roughness of the third surface is 0.1 μm or less, and the semiconductor chip is bonded to the substrate so that the second surface faces the first surface; wherein the semiconductor chip is transparent to light having at least a part of wavelengths of visible light and infrared light.

Details of Embodiments of the Present Disclosure

Specific examples of a semiconductor device and a method for manufacturing the same in accordance with embodiments of the present disclosure are described below with reference to the drawings. The present disclosure is not limited to these examples, but is indicated by the claims, which are intended to include all modifications within the meaning and scope of the claims.

First Embodiment

A first embodiment represents an example in which a nitride semiconductor chip such as a GaN HEMT is mounted by a FO-PLP (Fan-out Panel Level Package) by using an RDL (Redistribution Layer) first process method. The FO-PLP is a method for manufacturing a package on a square substrate having a width of 500 mm to 700 mm. The RDL first process method is a method of forming a rewiring layer on the square substrate and then mounting the semiconductor chip on the square substrate.

Figure 2:
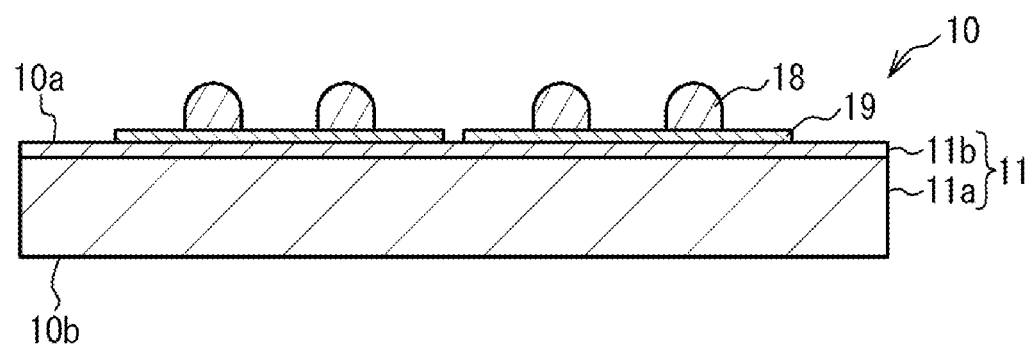
FIG. 2 is a cross-sectional view illustrating the semiconductor chip according to the first embodiment.

FIG. 1 is a plan view illustrating the semiconductor chip according to the first embodiment. FIG. 2 is a cross-sectional view illustrating the semiconductor chip according to the first embodiment. FIG. 2 corresponds to an A-A cross section of FIG. 1. As illustrated in FIGS. 1 and 2, a semiconductor chip 10 has a second surface 10a, and a third surface 10b which is an opposite surface of the second surface 10a. A substrate 11 includes a substrate 11a provided near the third surface 10b and a semiconductor layer 11b provided near the second surface 10a. When a GaN-HEMT is formed on the semiconductor chip 10, the substrate 11a is, for example, a SiC substrate, a sapphire substrate, or a GaN substrate. The thickness of the substrate 11a is, for example, 10 μm to 500 μm. The semiconductor layer 11b is, for example, a nitride semiconductor layer, for example, a GaN layer and an AlGaN layer (Al composition ratio is, for example, 0.3). The substrate 11 is substantially transparent to visible light and infrared light.

A pattern 19 is provided on the second surface 10a of the semiconductor chip 10. The pattern 19 includes source fingers 12, drain fingers 14, gate fingers 16, source pads 13, drain pads 15, gate pads 17, and a gate wiring 17a. The source finger 12 and the drain finger 14 are arranged alternately. The gate finger 16 is provided on the substrate 11 between the source finger 12 and the drain finger 14. The gate finger 16 is sandwiched between the source finger 12 and the drain finger 14. The plurality of source fingers 12 are connected to the source pad 13, and the plurality of drain fingers 14 are connected to the drain pad 15. The plurality of gate fingers 16 are connected to the gate pad 17 via the gate wiring 17a. The gate wiring 17a intersects the source finger 12 and the source pad 13 via an insulating layer or air. Protruding metal layers 18 are provided on the source pad 13, the drain pad 15, and the gate pad 17. The protruding metal layer 18 may not be provided.

Each of the source finger 12 and the drain finger 14 is a metal film, and includes, for example, a titanium film and an aluminum film from a position close to the substrate 11. The gate finger 16 is a metal film, and includes, for example, a nickel film and a gold film from a position close to the substrate 11. The source pad 13, the drain pad 15, the gate pad 17, and the gate wiring 17a are, for example, a metal layer of a gold layer. The protruding metal layer 18 is, for example, a gold bump, a copper bump, a copper pillar, or the like. The height of the protruding metal layer 18 is, for example, 5 μm to 50 μm.

Figure 3A:
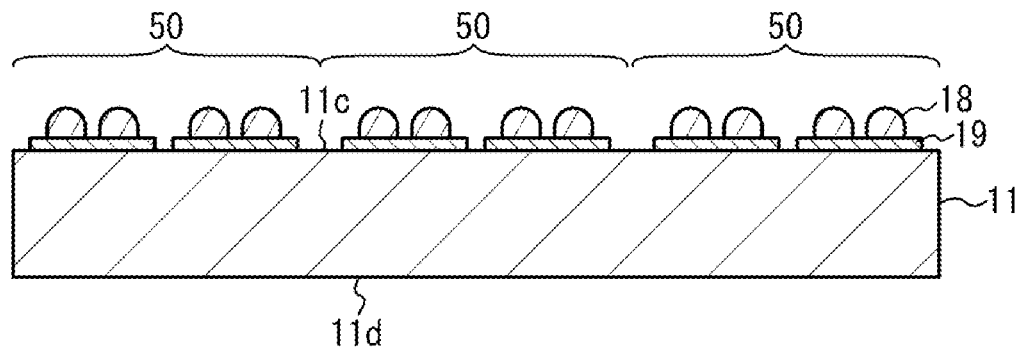
FIG. 3A is a cross-sectional view illustrating a method for manufacturing the semiconductor chip according to the first embodiment.
Figure 3B:
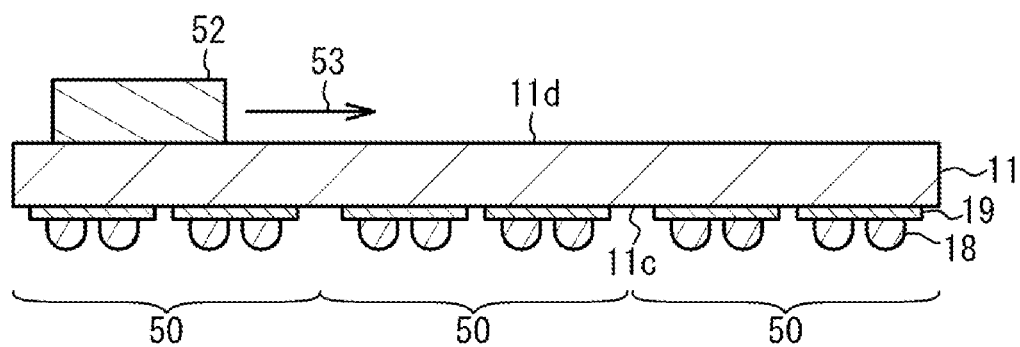
FIG. 3B is a cross-sectional view illustrating a method for manufacturing the semiconductor chip according to the first embodiment.
Figure 3C:
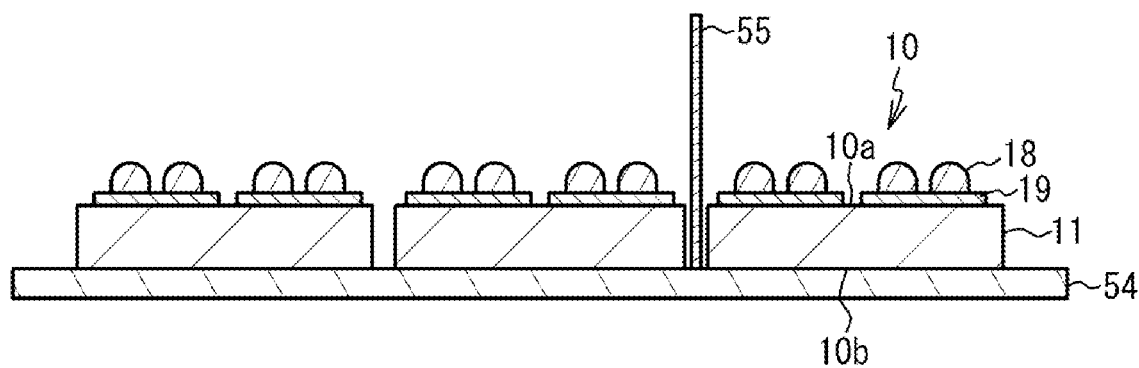
FIG. 3C is a cross-sectional view illustrating a method for manufacturing the semiconductor chip according to the first embodiment.

FIGS. 3A to 3C are cross-sectional views illustrating a method for manufacturing the semiconductor chip according to the first embodiment. As illustrated in FIG. 3A, the substrate 11 is a wafer, and regions 50 serving as a plurality of semiconductor chips are provided. The pattern 19 and the protruding metal layers 18 are formed on a surface 11c of each region 50. The thickness of the substrate 11 is, for example, 500 μm or more. If the substrate 11 transmits infrared rays when the pattern 19 or the like is formed on the surface 11c of the substrate 11, an infrared sensor of a semiconductor manufacturing apparatus cannot detect the wafer. Therefore, a back surface 11d of the substrate 11 is a rough surface.

As illustrated in FIG. 3B, the back surface 11d of the substrate 11 is polished with a grindstone 52 as illustrated by an arrow 53 to make the substrate 11 thinner. The thickness of the substrate 11 is, for example, 10 μm to 200 μm. At this time, the grain size of the grindstone 52 is set to, for example, #8000, so that the back surface 11d of the substrate 11 is a mirror surface. An arithmetic mean roughness Ra of the back surface 11d is, for example, 0.01 μm.

As illustrated in FIG. 3C, the back surface of the thinned substrate 11 is attached to a resin dicing film 54. The thinned substrate 11 is cut using a dicing blade 55. Thereby, the plurality of semiconductor chips 10 corresponding to the plurality of regions 50 are formed.

Figure 4A:
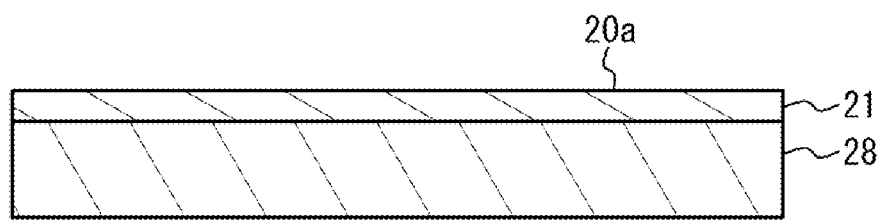
FIG. 4A is a cross-sectional view illustrating a method for manufacturing a substrate according to the first embodiment.
Figure 4B:
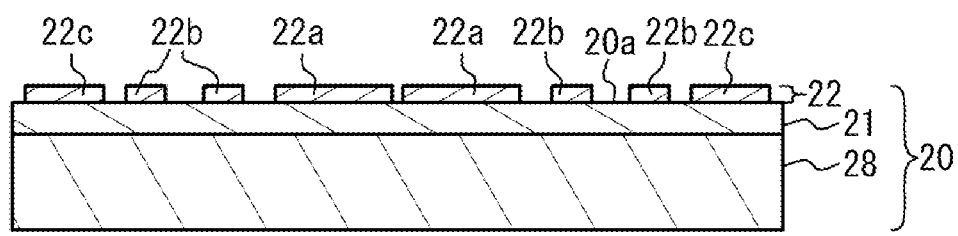
FIG. 4B is a cross-sectional view illustrating a method for manufacturing the substrate according to the first embodiment.
Figure 4C:
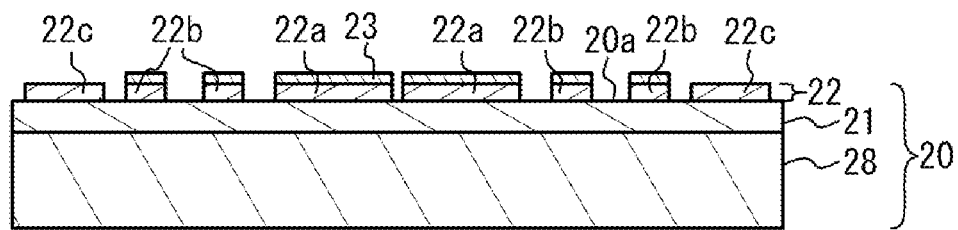
FIG. 4C is a cross-sectional view illustrating a method for manufacturing the substrate according to the first embodiment.

FIG. 4A to 4C are cross-sectional views illustrating a method for manufacturing a substrate according to the first embodiment. As illustrated in FIG. 4A, an insulating layer 21 is attached on a support substrate 28. The support substrate 28 is an insulating substrate such as a resin substrate, and reinforces the insulating layer 21 in a manufacturing process. The insulating layer 21 is, for example, a resin layer. An upper surface of the insulating layer 21 is a first surface 20a.

As illustrated in FIG. 4B, a wiring layer 22 is formed on the first surface 20a of the insulating layer 21 by, for example, a plating method. The wiring layer 22 is a metal layer such as a copper layer or a gold layer. The wiring layer 22 forms patterns 22a to 22c. Thereby, a substrate 20 is formed. The substrate 20 is, for example, a square substrate having a width of 500 mm to 700 mm, and the cross section of a region of a single semiconductor device is illustrated. As illustrated in FIG. 4C, a solder layer 23 is formed on the patterns 22a and 22b by using, for example, a printing method. The solder layer 23 is made of, for example, tin-silver-copper solder.

Figure 5:
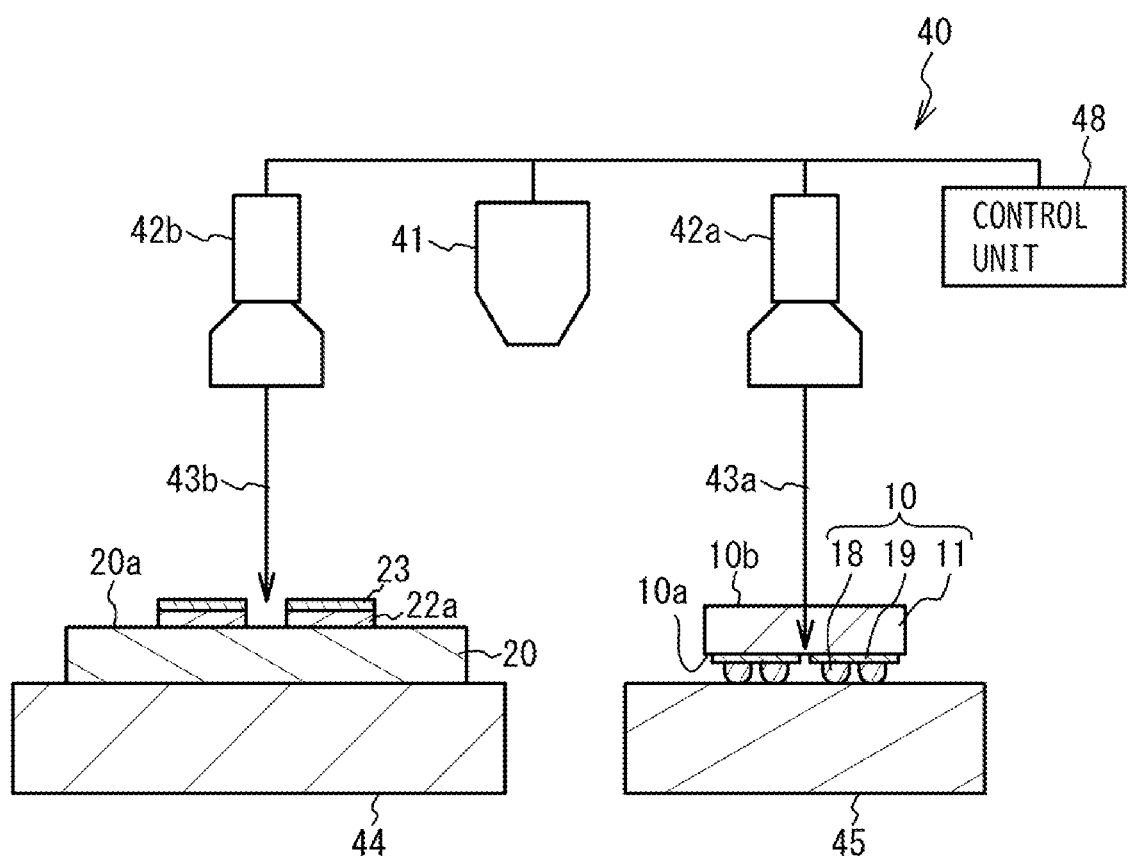
FIG. 5 is a cross-sectional view illustrating a method for mounting the semiconductor chip on the substrate in the first embodiment.
Figure 6:
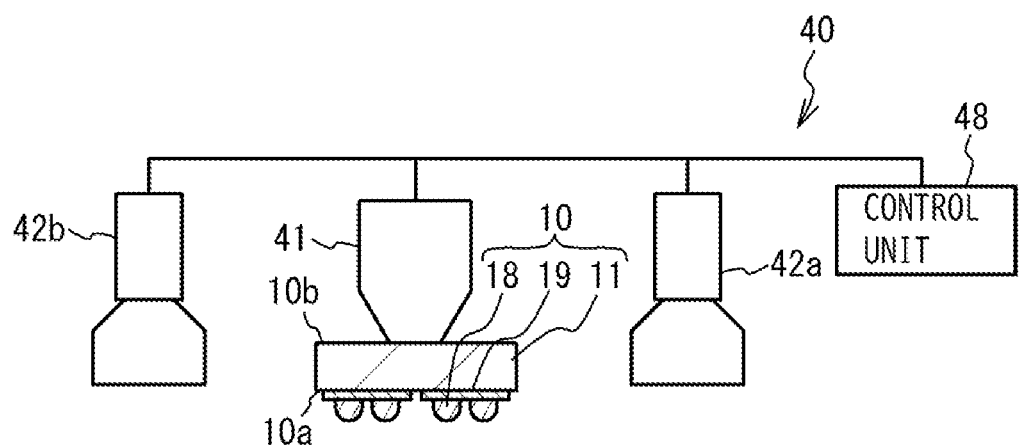
FIG. 6 is a cross-sectional view illustrating a method for mounting the semiconductor chip on the substrate according to the first embodiment.
Figure 6:
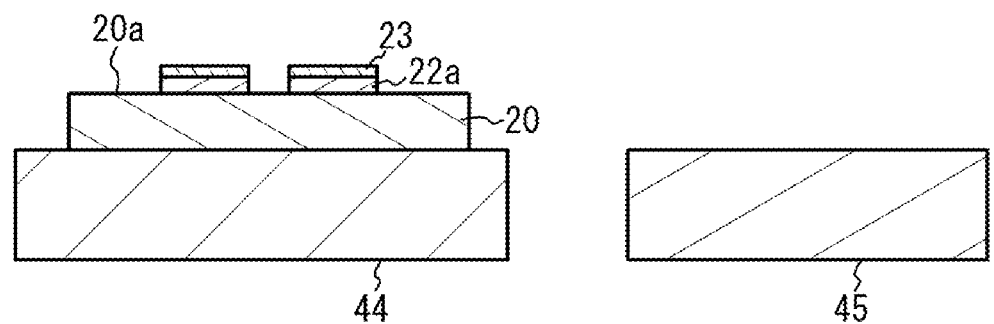

FIGS. 5 and 6 are cross-sectional views illustrating a method for mounting the semiconductor chip on the substrate in the first embodiment. As illustrated in FIG. 5, a general-purpose chip mounter 40 is used as a mounter for mounting the semiconductor chip 10 on the substrate 20. The chip mounter 40 includes cameras 42a and 42b, a collet 41, stages 44 and 45, and a control unit 48. The substrate 20 which is a large square substrate is mounted on the stage 44. The semiconductor chip 10 is mounted on the stage 45 for position correction. At this time, since the protruding metal layer 18 is in contact with the upper surface of the stage 45, it is possible to suppress the pattern 19 from coming into contact with the upper surface of the stage 45. Therefore, it is possible to suppress the stage 45 from coming into contact with the pattern 19 to form scratches on the pattern 19 and to suppress foreign matter from adhering to the pattern 19.

The camera 42a images the pattern 19 provided on the second surface 10a of the semiconductor chip 10 by transmitting through the substrate 11 from the third surface 10b side as illustrated by an arrow 43a. The camera 42a uses light having a wavelength transmitted through the substrate 11 to image the pattern 19. A SiC substrate, a sapphire substrate or a GaN substrate used as the substrate 11a is substantially transparent to visible light. When the nitride semiconductor layer is used as the semiconductor layer 11b, the GaN layer and the AlGaN layer are substantially transparent to visible light. Further, if the third surface 10b of the semiconductor chip 10 is not a mirror surface, light is diffusely reflected on the third surface 10b and the camera 42a cannot image the pattern 19. In the first embodiment, the arithmetic mean roughness Ra of the third surface 10b is set to 0.1 μm or less. Therefore, it is possible to suppress diffused reflection of light on the third surface 10b.

When a SiC substrate is used as the substrate 11a, SiC is substantially transparent to light having a wavelength of 0.38 μm to 5 μm. By using visible light of 0.38 μm to 0.78 μm and infrared light of 0.78 μm to 5 μm, the camera 42a can image the pattern 19 through the substrate 11. For example, LED (Light Emitting Diode) illumination that irradiates light having a wavelength of 0.42 μm to 0.66 μm or near-infrared illumination that irradiates light having a wavelength of 0.78 μm to 3 μm is used as the illumination of the semiconductor chip 10.

The camera 42b images the pattern 22a provided on the first surface 20a of the substrate 20 as illustrated by an arrow 43b. The control unit 48 calculates the relative position between the pattern 19 imaged by the camera 42a and the pattern 22a imaged by the camera 42b.

As illustrated in FIG. 6, the collet 41 adsorbs the third surface 10b of the semiconductor chip 10. Then, based on the relative position between the patterns 19 and 22a, the collet 41 moves the semiconductor chip 10 above the substrate 20. The collet 41 mounts the semiconductor chip 10 on the substrate 20.

Figure 7:
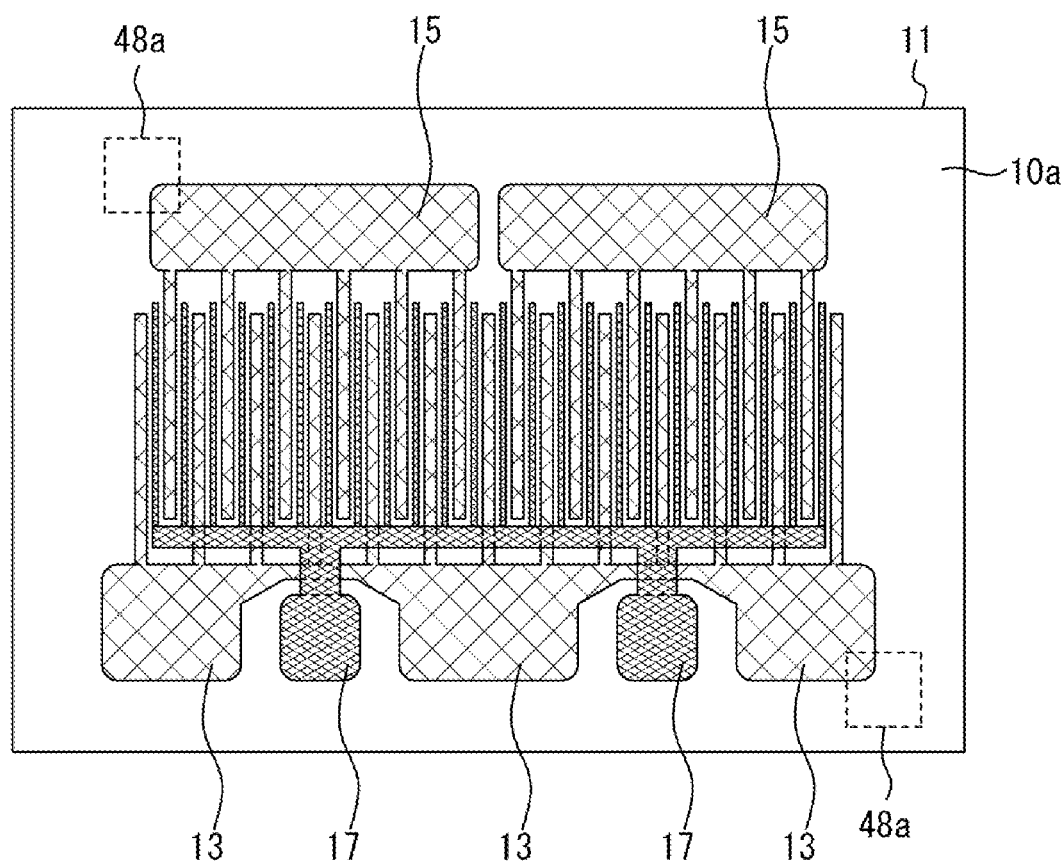
FIG. 7 is a plan view illustrating a state in which a pattern on a second surface of the semiconductor chip according to the first embodiment is viewed from a third surface.

FIG. 7 is a plan view illustrating a state in which the pattern on the second surface of the semiconductor chip according to the first embodiment is viewed from the third surface. As illustrated in FIG. 7, the pattern 19 on the second surface 10a can be visually recognized from the third surface 10b. The control unit 48 recognizes a pattern of recognition units 48a in the pattern 19. In order to improve an alignment accuracy between the patterns 19 and 22a, the recognition units 48a preferably have a diagonal pattern in the pattern 19, but the recognition units 48a may have a pattern other than the diagonal pattern.

Figure 8:
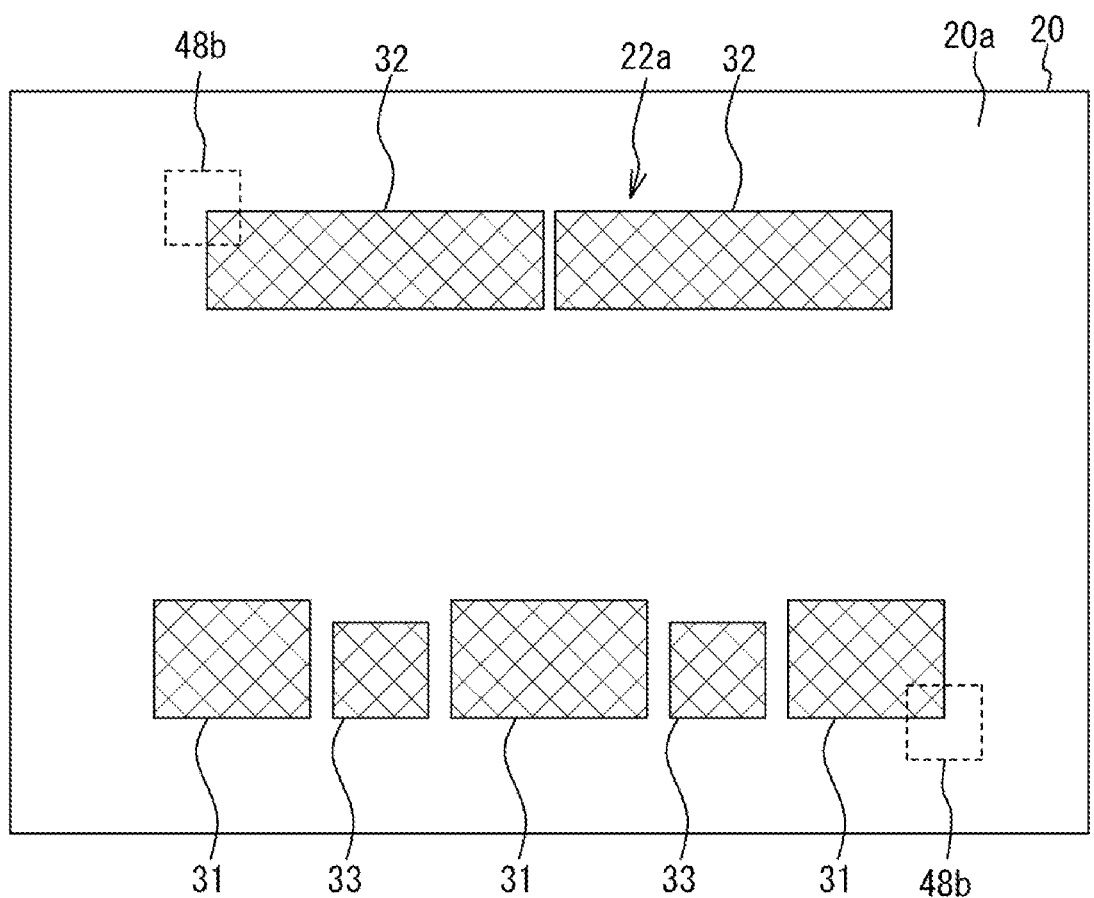
FIG. 8 is a plan view illustrating a pattern on a first surface of the substrate according to the first embodiment.

FIG. 8 is a plan view illustrating a pattern on the first surface of the substrate according to the first embodiment. As illustrated in FIG. 8, pads 31 to 33 are provided as the pattern 22a. The source pad 13, the drain pad 15, and the gate pad 17 are bonded to the pads 31 to 33, respectively. The control unit 48 recognizes a pattern of recognition units 48b in the pattern 22a.

Figure 9:
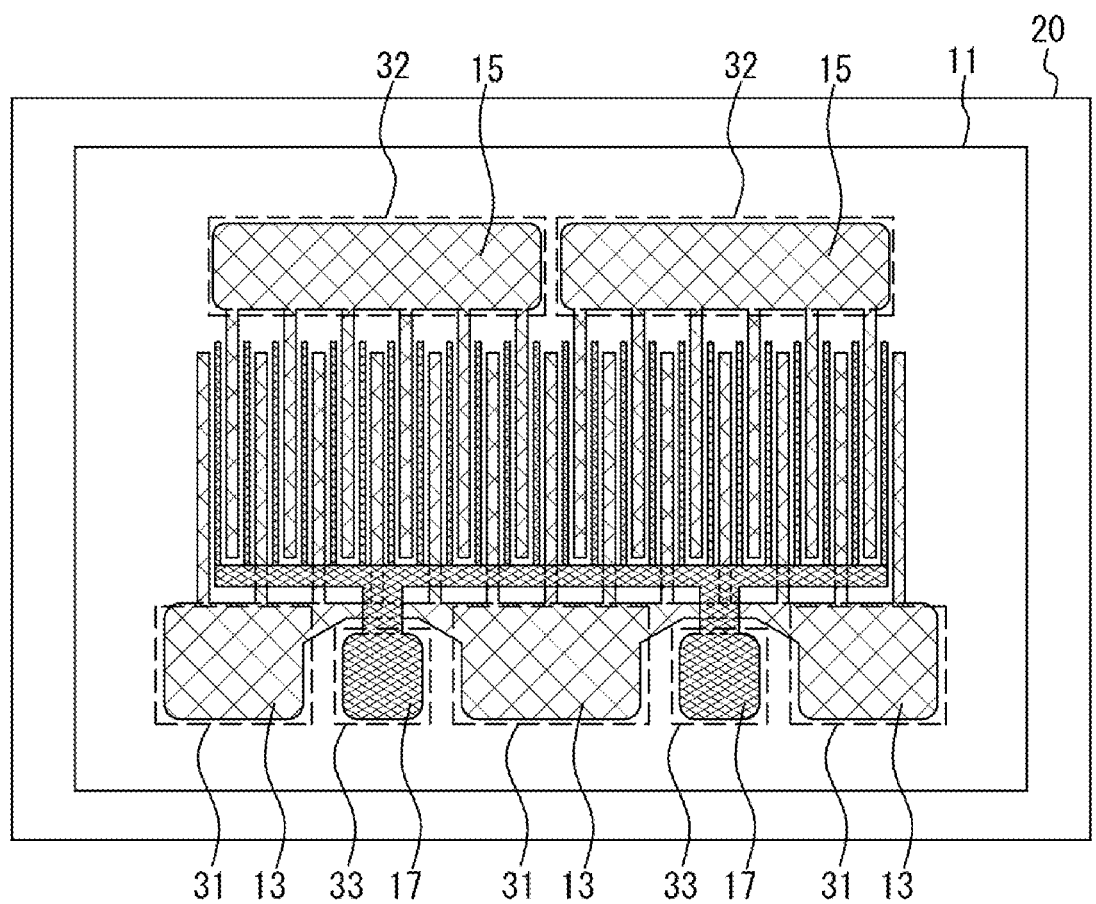
FIG. 9 is a diagram illustrating a state in which the semiconductor chip and the substrate after mounting the semiconductor chip according to the first embodiment are viewed from the third surface.

FIG. 9 is a diagram illustrating a state in which the semiconductor chip and the substrate after mounting the semiconductor chip according to the first embodiment are viewed from the third surface. As illustrated in FIG. 9, the source pads 13, the drain pads 15, and the gate pads 17 are bonded to the pads 31 to 33, respectively. In FIG. 5, the control unit 48 calculates the relative position between the semiconductor chip 10 and the substrate 20. In FIG. 6, the control unit 48 mounts the semiconductor chip 10 on the substrate 20 based on the calculated relative position. Therefore, the patterns 19 and 22a are aligned with each other. As illustrated in FIG. 9, after the semiconductor chip 10 is bonded to the substrate 20, the patterns 19 and 22a can be visually recognized from a position near the third surface 10b. This makes it possible to inspect the bonding state between the pads 31 to 33 and the source pad 13, the drain pad 15 and the gate pad 17 by using an automated visual inspection (AOI) device.

Figure 10A:
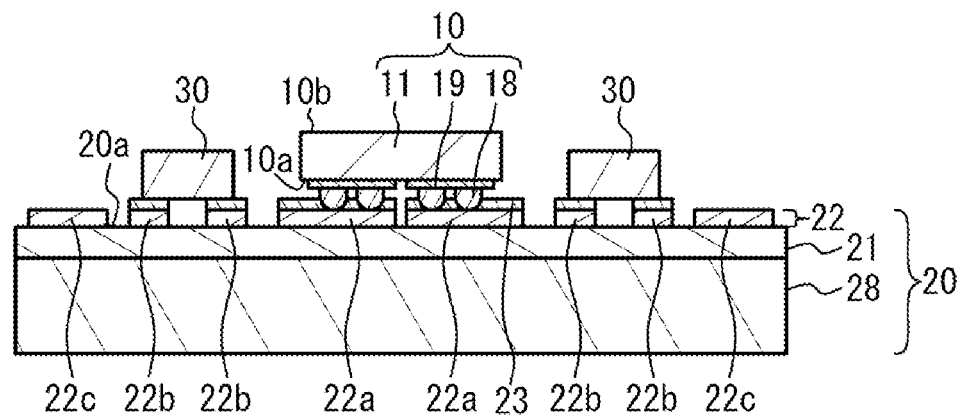
FIG. 10A is a cross-sectional view illustrating a method for manufacturing a semiconductor device according to the first embodiment.

FIGS. 10A to 11C are cross-sectional views illustrating a method for manufacturing the semiconductor device according to the first embodiment. As illustrated in FIG. 10A, the semiconductor chip 10 and chip components 30 are mounted on the substrate 20. The semiconductor chip 10 is mounted on the patterns 22a, and the chip components 30 are mounted on the patterns 22b. The chip component 30 is, for example, a chip resistor, a chip capacitor or a chip inductor. The general-purpose chip mounter 40 described with reference to FIGS. 5 and 6 is used for mounting the semiconductor chip 10 and the chip components 30. The reflow (i.e., heat treatment) melts the solder layer 23 and bonds the patterns 22a and 19 to each other. Thereby, the semiconductor chip 10 is flip-chip bonded to the substrate 20. The automatic visual inspection device is used to inspect the bonding state between the patterns 19 and 22a. In FIG. 10A, the solder layer 23 is bonded to the pattern 19 via the protruding metal layers 18, but the protruding metal layer 18 may be not provided, and the solder layer 23 may be directly bonded to the pattern 19.

Figure 10B:
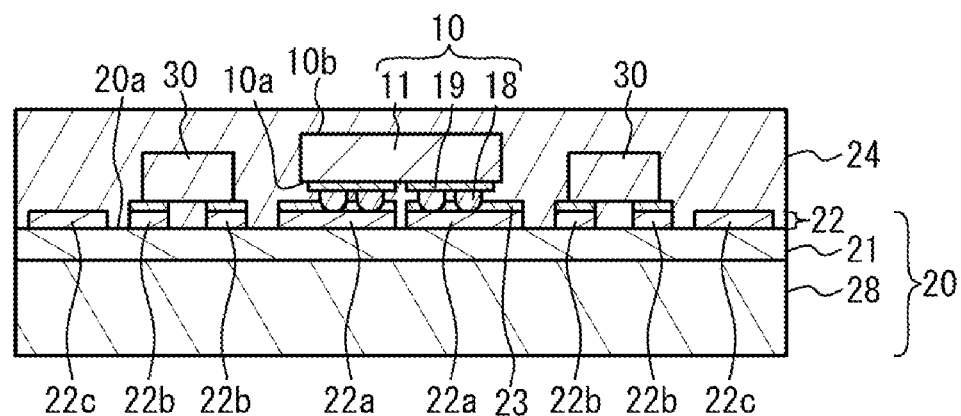
FIG. 10B is a cross-sectional view illustrating a method for manufacturing the semiconductor device according to the first embodiment.
Figure 10C:
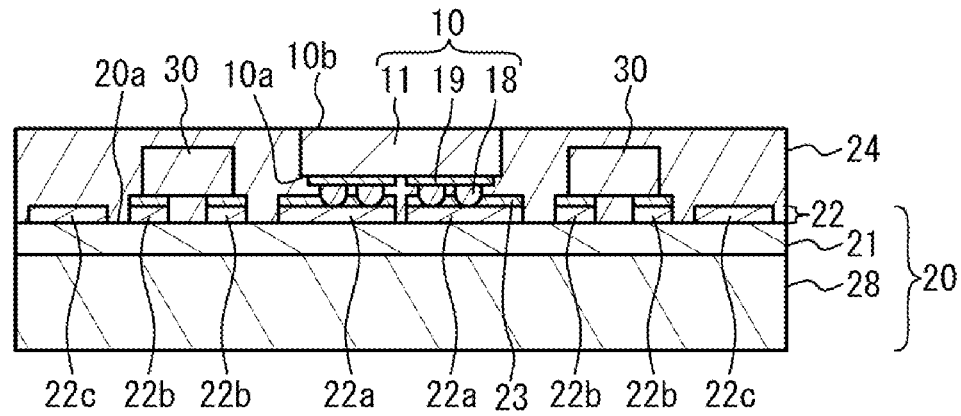
FIG. 10C is a cross-sectional view illustrating a method for manufacturing the semiconductor device according to the first embodiment.

As illustrated in FIG. 10B, a resin layer 24 is formed on the substrate 20 so as to cover the semiconductor chip 10 and the chip components 30. The resin layer 24 is formed by a laminating method in which a resin sheet such as an epoxy resin is attached. The resin layer 24 may be formed by using a molding method. As illustrated in FIG. 10C, an upper surface of the resin layer 24 is ground or polished to expose the third surface 10b of the semiconductor chip 10.

Figure 11A:
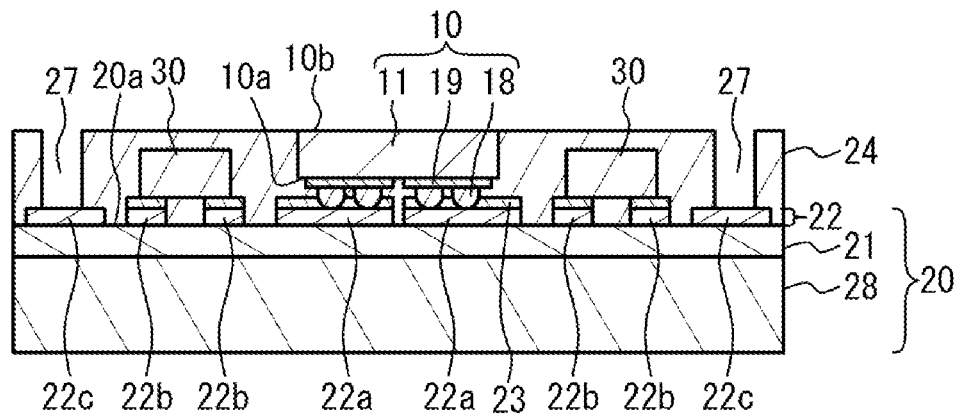
FIG. 11A is a cross-sectional view illustrating a method for manufacturing the semiconductor device according to the first embodiment.
Figure 11B:
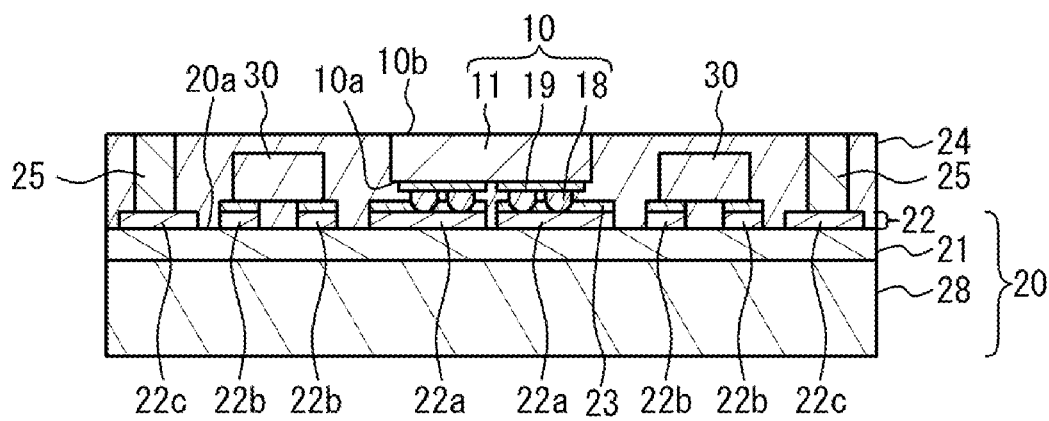
FIG. 11B is a cross-sectional view illustrating a method for manufacturing the semiconductor device according to the first embodiment.

As illustrated in FIG. 11A, through holes 27 penetrating the resin layer 24 are formed by, for example, an etching method. The patterns 22c are exposed from the through holes 27. As illustrated in FIG. 11B, through electrodes 25 are formed in the through holes 27 by using, for example, the plating method. The through electrodes 25 are a metal layer such as a copper layer or a gold layer.

Figure 11C:
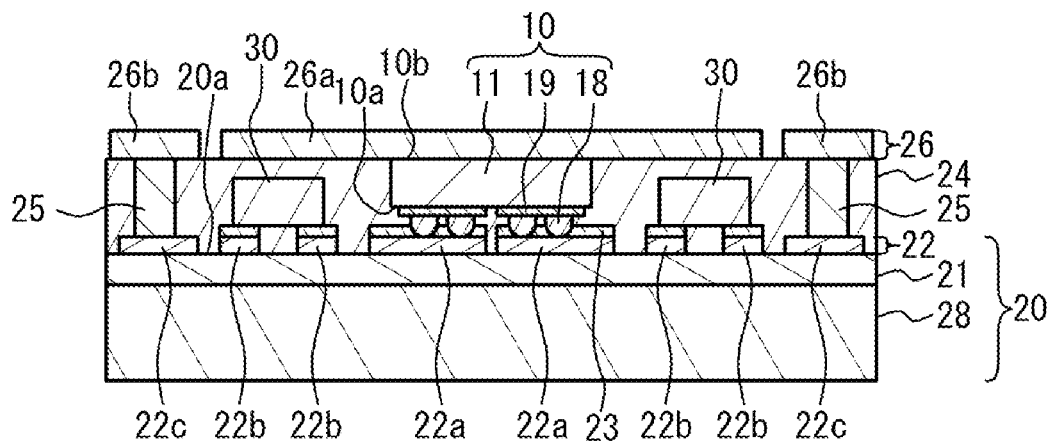
FIG. 11C is a cross-sectional view illustrating a method for manufacturing the semiconductor device according to the first embodiment.

As illustrated in FIG. 11C, a metal layer 26 is formed on the resin layer 24 by using, for example, the plating method. The metal layer 26 is, for example, a copper layer. The metal layer 26 includes patterns 26a and 26b. The pattern 26a comes into contact with the third surface 10b of the semiconductor chip 10 and functions as a heat radiating layer that releases the heat generated in the semiconductor chip 10. The patterns 26b are electrically connected to the patterns 22c of the wiring layer 22 via the through electrodes 25. The patterns 22c are electrically connected to the patterns 22a and 22b. Thereby, the patterns 22b function as an external terminal for electrically connecting the semiconductor chip 10 and the chip component 30 to an external device.

Figure 12:
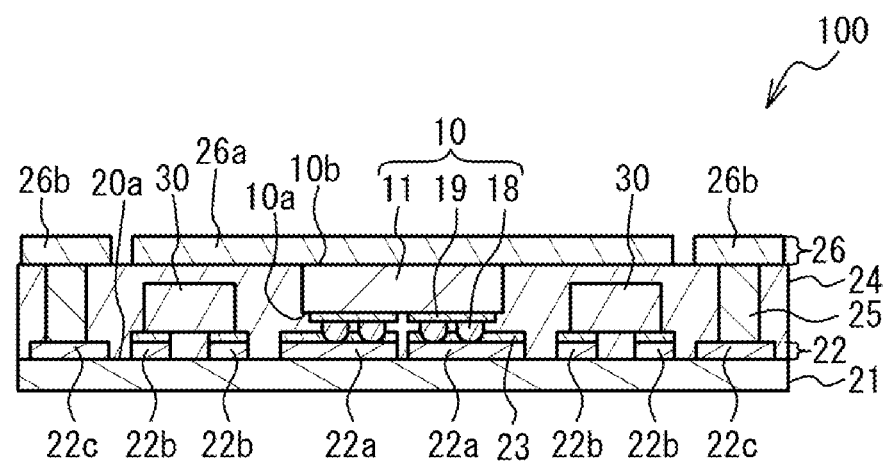
FIG. 12 is a cross-sectional view illustrating the semiconductor device according to the first embodiment.

FIG. 12 is a cross-sectional view illustrating the semiconductor device according to the first embodiment. As illustrated in FIG. 12, the support substrate 28 is removed from the insulating layer 21. Then, the insulating layer 21 and the resin layer 24 are cut and separated into individual pieces. Thereby, the semiconductor device 100 is manufactured.

Figure 13:
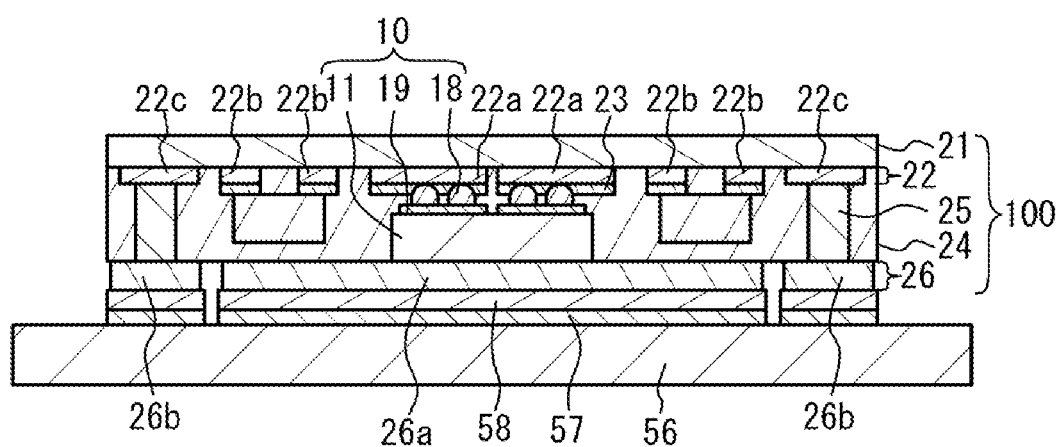
FIG. 13 is a cross-sectional view in which the semiconductor device according to the first embodiment is mounted.

FIG. 13 is a cross-sectional view in which the semiconductor device according to the first embodiment is mounted. As illustrated in FIG. 13, a metal layer 57 is provided on a printed circuit board 56. The metal layer 57 and the metal layer 26 of the semiconductor device 100 are bonded via a solder layer 58.

Comparative Example

Nitride semiconductor devices such as GaN HEMTs are used in high-frequency power amplification devices for base stations of the mobile communication. Therefore, the semiconductor devices are required to maintain high frequency characteristics, secure dissipate heat, and reduce costs. As a method for mounting the semiconductor chips with GaN HEMTs or the like, a first comparative example in which the semiconductor chips are mounted in a package in a face-up manner is considered. A bonding wire is connected to an upper surface of the semiconductor chip, and a high frequency signal is input to and output from the semiconductor chip via the bonding wire. In the first comparative example, when the semiconductor chip is face-up mounted, it is difficult to reduce costs because an expensive nano-silver paste is used to secure the heat dissipation. Since the high frequency signal is input to and output from the semiconductor chip via an inductance of the bonding wire, the high frequency characteristics are deteriorated.

Therefore, it is conceivable to mount the semiconductor chip by FO-PLP (Fan-out Panel Level Package) as a second comparative example. In the second comparative example, since the semiconductor chip 10 is flip-chip bonded, the deterioration of high-frequency characteristics can be suppressed as compared with a case where the bonding wire as in the first comparative example is used. Since the metal layer 26 can be directly bonded to the third surface 10b of the semiconductor chip 10, the expensive nano-silver paste does not need to be used as in the first comparative example, and the cost can be reduced.

Figure 14:
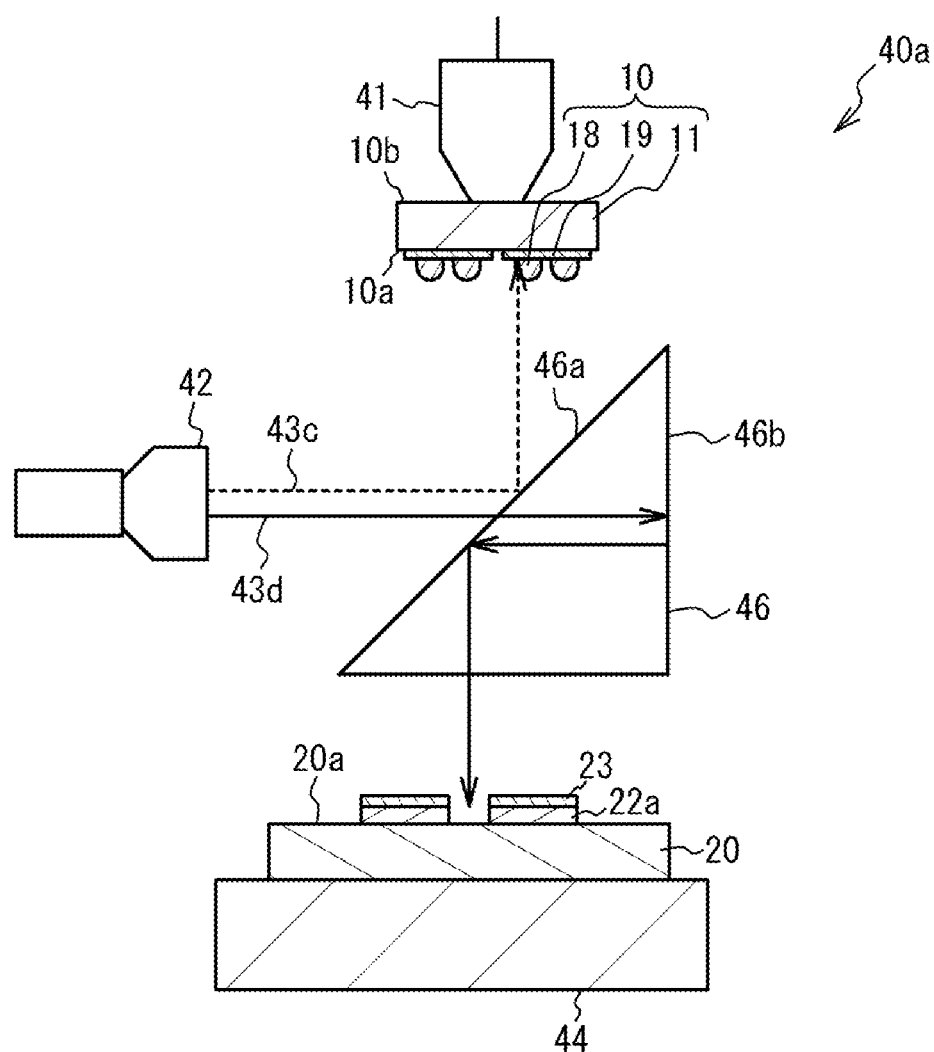
FIG. 14 is a cross-sectional view illustrating a method for mounting the semiconductor chip on the substrate in a second comparative example.
Figure 15:
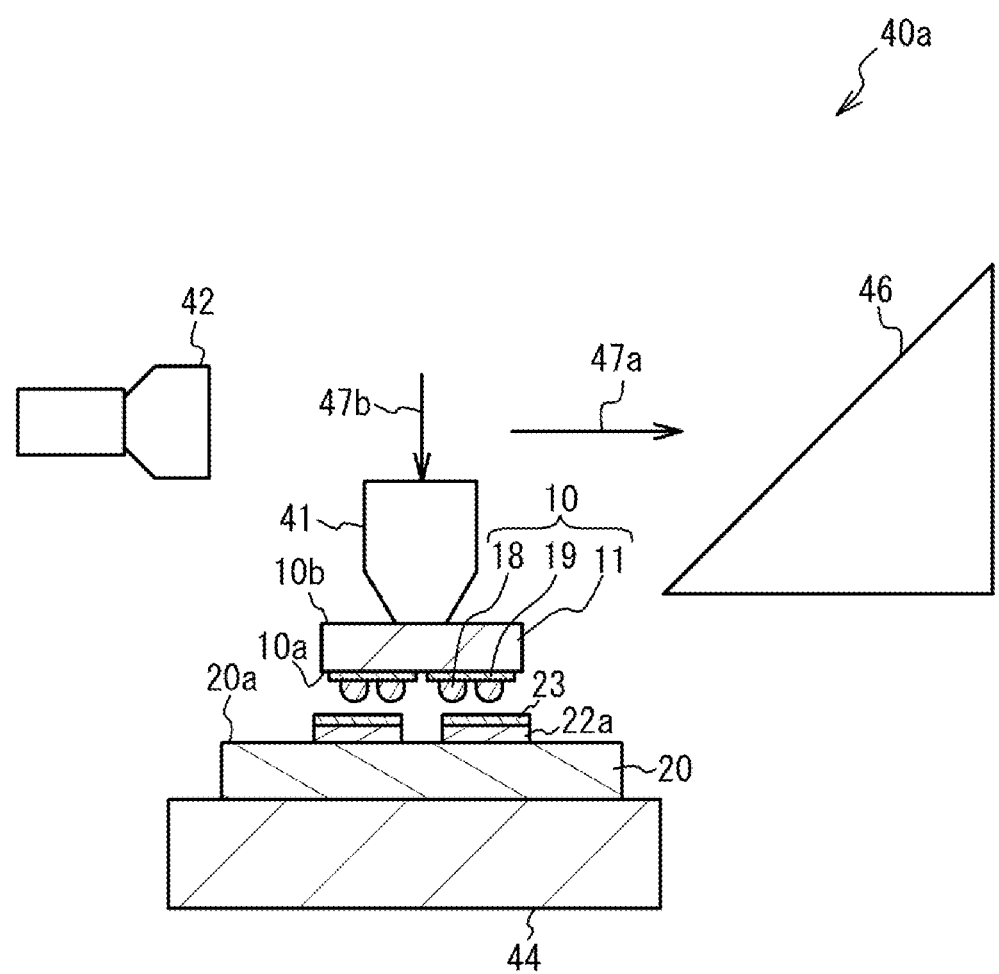
FIG. 15 is a cross-sectional view illustrating a method for mounting the semiconductor chip on the substrate in the second comparative example.

FIGS. 14 and 15 is cross-sectional views illustrating a method for mounting the semiconductor chip on the substrate in the second comparative example. In the second comparative example, a flip chip bonder 40a is used as a mounter for mounting the semiconductor chip 10 on the substrate 20, as illustrated in FIG. 14. The flip chip bonder 40a includes a camera 42, the collet 41, the stage 44, and an optical system 46. The optical system 46 has a half mirror surface 46a and a mirror surface 46b, and is arranged between the patterns 22a and 19. The camera 42 can capture an image of the pattern 19 reflected on the half mirror surface 46a as illustrated by an arrow 43c. Further, the camera 42 can capture an image of the pattern 22a that passes through the half mirror surface 46a, is reflected on the mirror surface 46b, and is reflected on the half mirror surface 46a, as illustrated by an arrow 43d. The collet 41 moves the semiconductor chip 10 so that the pattern 19 overlap with the pattern 22a.

As illustrated in FIG. 15, after the position of the semiconductor chip 10 in a plane direction is determined, the optical system 46 retracts as illustrated by an arrow 47a. As illustrated by an arrow 47b, the collet 41 is moved downward and the semiconductor chip 10 is mounted on the substrate 20. In the second comparative example, the optical system 46 is used to align the patterns 19 and 22a, which improves the alignment accuracy. However, the tact time is long due to the retraction of the optical system 46, making it unsuitable for mass production. This increases the cost of mass production.

As a third comparative example, the semiconductor chip 10 can be mounted on the substrate 20 without recognizing the patterns 19 and 22a by using the chip mounter as illustrated in FIG. 5. However, the alignment accuracy between the patterns 19 and 22a is reduced.

According to the first embodiment, the semiconductor chip 10 having the pattern 19 (second pattern) on the second surface 10a is prepared as illustrated in FIGS. 3A to 3C. The substrate 20 (first substrate) having the pattern 22a (first pattern) on the first surface 20a is prepared as illustrated in FIGS. 4A to 4C. As illustrated in FIGS. 5, 7 and 8, the camera 42a recognizes the pattern 19 by transmitting through the semiconductor chip 10 from a position near the third surface 10b among the second surface 10a and the third surface 10b in the semiconductor chip 10, and the camera 42b recognizes the pattern 22a from a position near the first surface 20a among the first surface 20a and a lower surface opposite to the first surface 20a in the substrate 20. As illustrated in FIGS. 6 and 9, the control unit 48 aligns the semiconductor chip 10 and the substrate 20 based on the recognition results of the patterns 19 and 22a, and the semiconductor chip 10 is flip-chip bonded on the substrate 20 so that the second surface 10a faces the first surface 20a. This eliminates the need for the complicated flip chip bonder 40a as illustrated in FIGS. 14 and 15 of the second comparative example, and the use of the general-purpose chip mounter 40 shortens the tact time and enables the mass production of semiconductor devices. Therefore, the cost of semiconductor device 100 can be reduced. In addition, it is possible to suppress a decrease in alignment accuracy as in the third comparative example.

As illustrated in FIG. 5, the substrate 20 is arranged on the stage 44 (first stage) with the first surface 20a facing up, and the semiconductor chip 10 is arranged on the stage 45 (second stage) with the third surface 10b facing up. In this state, the pattern 22a is recognized from above, and the pattern 19 is recognized by transmitting through the semiconductor chip 10 from above. As illustrated in FIG. 6, the collet 41 (suction member) sucks the third surface 10b of the semiconductor chip 10 on the stage 45, and moves the semiconductor chip 10 onto the stage 44 to mount the semiconductor chip 10 on the substrate 20. This enables mass production of the semiconductor devices using the general-purpose chip mounter 40.

The semiconductor chip 10 is transparent to light having at least a part of the wavelengths of visible light and infrared light. As illustrated in FIG. 5, in a step of flip-chip bonding the semiconductor chip 10 to the substrate 20, the camera 42a recognizes the pattern 19 by using the light transmitted through the semiconductor chip 10. Thereby, the camera 42a can recognize the pattern 19 by using the light transmitted through the semiconductor chip 10 from the position near the third surface 10b among the second surface 10a and the third surface 10b in the semiconductor chip 10. A transmittance of the semiconductor chip 10 with respect to the light used for recognizing the pattern 19 is preferably 20% or more, more preferably 50% or more, still more preferably 80% or more. Thereby, the camera 42a can recognize the pattern 19 by using the light transmitted through the semiconductor chip 10.

The substrate 11a (second substrate) is a SiC substrate, a sapphire substrate, or a GaN substrate, and the semiconductor layer 11b is a nitride semiconductor layer. This makes the substrate 11a and the semiconductor layer 11b transparent to light having at least a part of the wavelengths of the visible light and the infrared light. The SiC substrate has a high thermal conductivity, which enables heat dissipation from the third surface 10b.

The semiconductor chip 10 is a semiconductor chip that processes (for example, amplifies) the high frequency signal. Thus, in the semiconductor chip 10 that processes the high frequency signal, the high frequency characteristics change depending on the alignment position of the patterns 19 and 22a. Therefore, according to the first embodiment, the alignment accuracy can be improved and the high frequency characteristics can be stabilized. The high frequency signal is, for example, a signal of 0.5 GHz to 100 GHz, and typically a signal of 0.5 GHz to 10 GHz.

If the third surface 10b is rough, light is diffusely reflected on the third surface 10b. Therefore, the camera 42a cannot recognize the pattern 19. Therefore, an arithmetic mean roughness Ra of the third surface 10b is preferably 0.1 μm or less, more preferably 0.05 μm or less, and even more preferably 0.02 μm or less.

As illustrated in FIG. 11C, after the flip chip bonding step, the metal layer 26 is formed on the third surface 10b of the semiconductor chip 10. Thereby, the metal layer 26 and the third surface 10b are directly bonded to each other, and the metal layer 26 can be used as a heat dissipation layer. If the metal layer 26 is formed by using the plating method, the expensive nano-silver paste does not need to be used as in the first comparative example, and the cost of the semiconductor device 100 can be reduced.

According to the semiconductor device 100 of the first embodiment, the pattern 22a (first pattern) is provided on the first surface 20a, and the pattern 19 (second pattern) is provided on the second surface 10a. The semiconductor chip 10 is flip-chip bonded on the substrate 20 so that the second surface 10a faces the first surface 20a. The semiconductor chip 10 is transparent to the light having at least a part of the wavelengths of the visible light and the infrared light, and the arithmetic mean roughness of the third surface 10b is 0.1 μm or less. In this way, the third surface 10b is a mirror surface, and the semiconductor chip 10 is transparent to the light having at least a part of the wavelengths of the visible light and the infrared light. This allows the semiconductor chip 10 to be flip-chip bonded onto the substrate 20 using the general-purpose chip mounter, as illustrated in FIGS. 5 and 6. Therefore, the cost of the semiconductor device 100 can be reduced.

In the first embodiment, the semiconductor chip 10 provided with a single GaN HEMT has been described as an example, but the semiconductor chip 10 may be an MIMIC (Monolithic Microwave Integrated Circuit). An example of using the FO-PLP technology as the semiconductor device has been described, but it is sufficient if the semiconductor chip is flip-chip bonded to the substrate.

The embodiments disclosed here should be considered illustrative in all respects and not restrictive. The present disclosure is not limited to the specific embodiments described above, but various variations and changes are possible within the scope of the gist of the present disclosure as described in the claims.

What is claimed is:

1. A method for manufacturing a semiconductor device that improves alignment accuracy and manufacturing efficiency in flip-chip bonding by optically recognizing patterns through a transparent semiconductor chip with a mirror-polished surface, the method comprising:
    preparing a first substrate provided with a first pattern on a first surface;
    preparing a semiconductor chip having a second surface, and a third surface opposite to the second surface, and including a second pattern provided on the second surface;
    arranging the first substrate on a first stage with the first surface facing away from the first stage;

arranging the semiconductor chip on a second stage with the third surface facing away from the second stage;

recognizing the first pattern from a position near the first surface among the first surface and an opposite surface thereof in the first substrate while the first substrate is on the first stage;

irradiating the semiconductor chip with light from a position near the third surface, the semiconductor chip being transparent to the light, and recognizing the second pattern by detecting the light transmitted through the semiconductor chip from the second surface to the third surface while the semiconductor chip is on the second stage;

picking up and moving the semiconductor chip from the second stage to an area above the first substrate on the first stage;

aligning the semiconductor chip and the first substrate based on a recognition result of the first pattern and the second pattern; and bonding the semiconductor chip to the first substrate so that the second surface faces the first surface, wherein the bonding comprises a flip-chip process that reduces signal path inductance and enhances high-frequency performance of the semiconductor device.

2. The method for manufacturing the semiconductor device as claimed in claim 1, wherein the recognizing the first pattern includes recognizing the first pattern from above in a state where the first substrate is arranged on the first stage with the first surface facing up and the semiconductor chip is arranged on the second stage with the third surface facing up, the recognizing the second pattern includes recognizing the second pattern by transmitting through the semiconductor chip in the state, and the bonding the semiconductor chip includes mounting semiconductor chip on the first substrate by sucking the third surface of the semiconductor chip on the second stage and moving the semiconductor chip onto the first stage.

3. The method for manufacturing the semiconductor device as claimed in claim 1, wherein the semiconductor chip is transparent to light having at least a portion of wavelengths of visible light and infrared light, and the recognizing the second pattern includes detecting the second pattern using the light having at least the portion of the wavelengths.

4. The method for manufacturing the semiconductor device as claimed in claim 1, wherein the semiconductor chip is a SiC substrate, a sapphire substrate, or a GaN substrate, and the semiconductor chip includes a second substrate having the third surface, and a nitride semiconductor layer provided on the second substrate and having the second surface.

5. The method for manufacturing the semiconductor device as claimed in claim 1, wherein an arithmetic mean roughness of the third surface is 0.1 μm or less.

6. The method for manufacturing the semiconductor device as claimed in claim 1, wherein the semiconductor chip processes a high frequency signal.

7. The method for manufacturing the semiconductor device as claimed in claim 1, further comprising:

forming a metal layer on the third surface of the semiconductor chip after the bonding.

8. A semiconductor assembly comprising:

the semiconductor device manufactured according to the method of claim 1 wherein the semiconductor chip is transparent to light having at least a part of wavelengths of visible light and infrared light.

* * * * *